(12) United States Patent
Kataoka

(10) Patent No.: US 7,816,609 B2
(45) Date of Patent: Oct. 19, 2010

(54) WIRED CIRCUIT BOARD

(75) Inventor: Kouji Kataoka, Osaka (JP)

(73) Assignee: Nitto Denko Corporation, Osaka (JP)

( * ) Notice: Subject to any disclaimer, the term of this patent is extended or adjusted under 35 U.S.C. 154(b) by 872 days.

(21) Appl. No.: 11/607,037

(22) Filed: Dec. 1, 2006

(65) Prior Publication Data

US 2007/0128952 A1    Jun. 7, 2007

(30) Foreign Application Priority Data

Dec. 2, 2005    (JP) .............................. 2005-349558

(51) Int. Cl.
*H05K 1/00*    (2006.01)
(52) U.S. Cl. ....................................... 174/254; 361/749
(58) Field of Classification Search ................. 174/254; 361/749–751
See application file for complete search history.

(56) References Cited

U.S. PATENT DOCUMENTS 4,495,546 A * 1/1985 Nakamura et al. .......... 361/749

2004/0256147 A1 * 12/2004 Shigetaka ................... 174/254

FOREIGN PATENT DOCUMENTS

| JP | 58-116262 | 8/1983 |
|---|---|---|
| JP | 58-225688 | 12/1983 |
| JP | 04-208588 | 7/1992 |
| JP | 5-152693 | 6/1993 |
| JP | H07-170033 | 7/1995 |
| JP | 2001-332818 | 11/2001 |

* cited by examiner

*Primary Examiner*—Jeremy C Norris
(74) *Attorney, Agent, or Firm*—Jean C. Edwards, Esq.; Akerman Senterfitt

(57) ABSTRACT

A wired circuit board is provided having a reinforced part thickened to ensure a high rigidity when it is used, while having the reinforced part thinned for easy handling when it is not yet used to prevent a cost increase and a productivity reduction. When the wired circuit board is used, a folding portion is valley-folded to laminate a reinforcing portion on a second connecting portion to contact the back surface of a fourth reinforcing plate of the reinforcing portion with the back surface of a second reinforcing plate of the second connecting portion. This achieves to reinforce the second connecting portion with the second reinforcing plate and the reinforcing portion and ensure a high rigidity by thickening the reinforced part. Since the reinforcing portion is supported in the same plane as a wired circuit portion via the folding portion before it is used, the reinforced part can be thinned and easy handling is achieved.

4 Claims, 9 Drawing Sheets

FIG. 3
(a) A-A
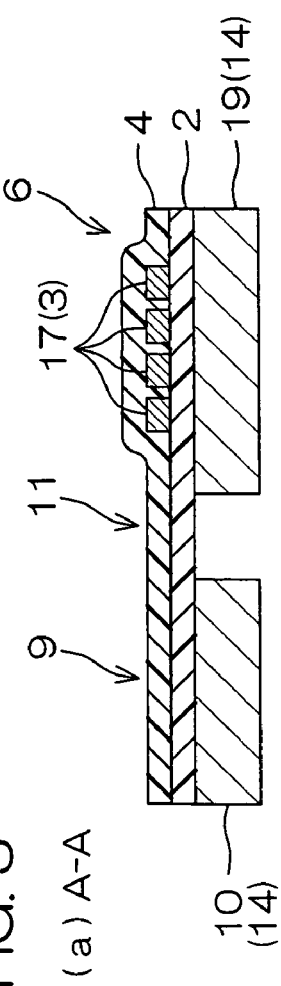
(b) B-B
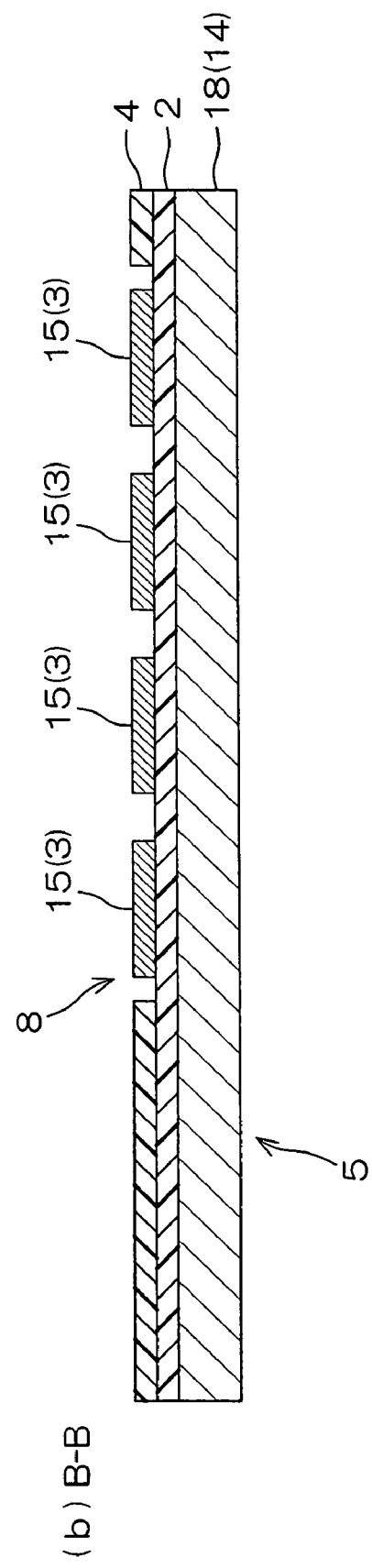

FIG. 6
(a)
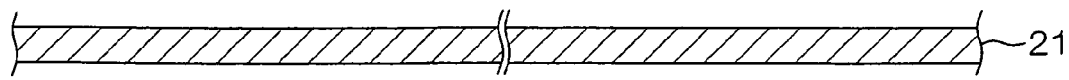
(b)
(c)
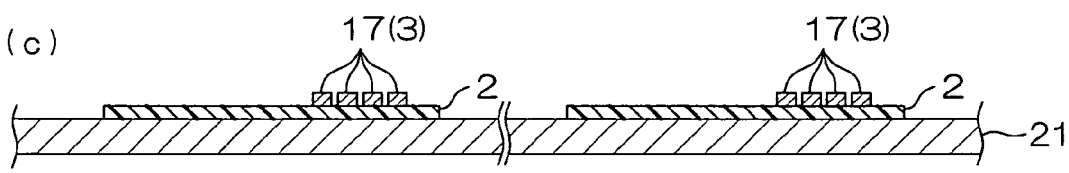
(d)
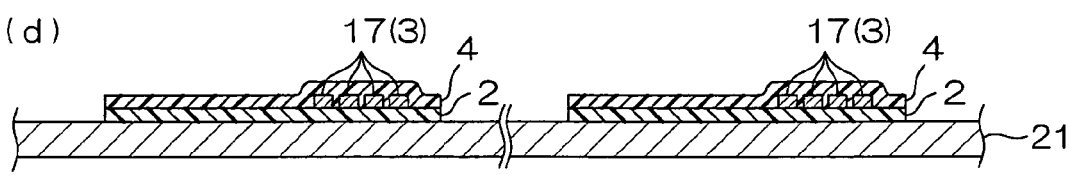
(e)
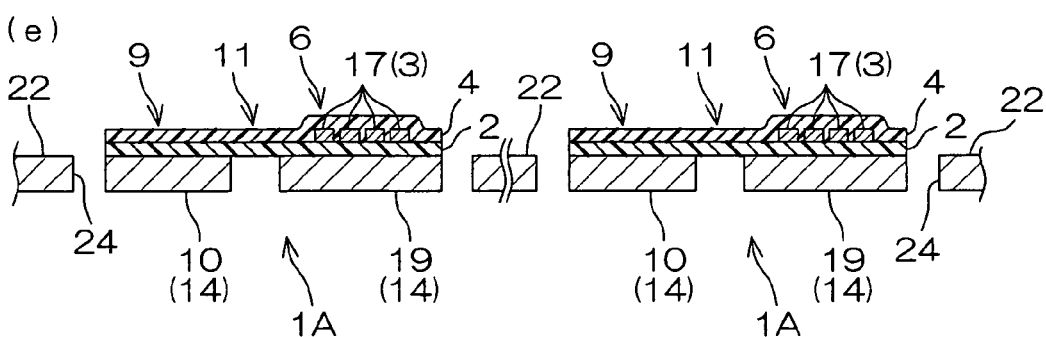

US 7,816,609 B2

WIRED CIRCUIT BOARD

CROSS-REFERENCE TO RELATED APPLICATION

The present application claims priority from Japanese Patent Application No. 2005-349558 filed on Dec. 2, 2005, the content of which is hereby incorporated by reference into this application.

BACKGROUND OF THE INVENTION

1. Field of the Invention

The present invention relates to a wired circuit board, more particularly, to a wired circuit board such as a flexible wired circuit board.

2. Description of Related Art

A flexible wired circuit board is a wired circuit board having flexibility and typically comprises a insulating base layer made of a flexible resin film, a conductive pattern made of metal foil formed on a surface of the insulating base layer and an insulating cover layer made of a flexible resin film formed on the surface of the insulating base layer to cover the conductive pattern.

Such a flexible wired circuit board has terminal portions each for connecting to an external circuit or mounting an electronic component, which are provided as the portions of the conductive pattern exposed from openings in the insulating cover layer.

Because the external circuit is connected to the terminal portions or the electronic component is mounted thereon, the portions of the flexible wired circuit board on which the terminal portions are provided need to have a certain level of strength. To satisfy the need, it has been known to bond a reinforcing plate to the back surface of the insulating base layer. For example, it has been proposed to back the terminal portions of a flexible wired circuit board with a reinforcing plate made of an aluminum plate via an adhesive agent (see, e.g., Japanese Unexamined Patent Publication No. 07-170033).

However, when a high rigidity is needed, it is necessary to thicken the reinforcing plate. In the manufacturing of a wired circuit board, there is a case where a number of wired circuit boards are manufactured as in a single sheet and the sheet is wound up and stored in the form of a roll. In such a case, when the reinforcing plate is thick, it is difficult to wind up the sheet into the form of a roll. In addition, when the sheet is stored in the form of a roll, a problem occurs such that the reinforcing plate remains gently curled even after the sheet is unwound and cannot recover its original flat shape.

In addition, the backing of the sheet with the reinforcing plate via the adhesive agent leads to an increase in cost since it requires additional use of the adhesive agent for the backing. Moreover, an extra process step is needed for the backing to cause the problem of a productivity reduction.

SUMMARY OF THE INVENTION

It is therefore an object of the present invention to provide a wired circuit board which has a reinforced part thereof thickened to ensure a high rigidity when it is used, while having the reinforced part thinned for easy handling when it is not yet used, and which can also prevent a cost increase and a productivity reduction.

A wired circuit board according to the present invention comprises: a wired circuit portion comprising a terminal formation portion formed with a terminal portion and a reinforcing plate provided at least on the terminal formation portion; a reinforcing portion which can be laminated on the reinforcing plate; and a folding portion for coupling the terminal formation portion and the reinforcing portion, and foldable.

In the wired circuit board according to the present invention, when it is used, the folding portion is folded over to laminate the reinforcing portion on the reinforcing plate, thereby reinforcing the terminal formation portion with the reinforcing plate and the reinforcing portion. As a result, the reinforced part is thickened to ensure a high rigidity. When the wired circuit board is not yet used, on the other hand, the folding portion is not folded over, so that the terminal formation portion is reinforced only with the reinforcing plate. As a result, the reinforced part is thinned to achieve easy handling.

Thus, by merely folding the folding portion over and laminating the reinforcing portion on the reinforcing plate, the terminal formation portion can be reinforced. This can prevent a cost increase and a productivity reduction.

In the wired circuit board according to the present invention, it is preferable that the wired circuit portion preferably comprises: a supporting layer made of a metal; a insulating base layer made of a resin and formed on a surface of the supporting layer; a conductive layer made of a conductor and formed on a surface of the insulating base layer; and an insulating cover layer made of a resin and formed on a surface of the conductive layer, wherein the reinforcing plate is formed of the supporting layer, and the reinforcing portion preferably comprises at least the supporting layer.

Since the reinforcing portion comprises at least the same supporting layer as the supporting layer of the reinforcing plate, a cost reduction and a productivity improvement can be achieved by forming these supporting layers from a common supporting layer.

In the wired circuit board according to the present invention, it is preferable that the folding portion comprises at least one layer selected from the group consisting of the insulating base layer, the conductive layer, and the insulating cover layer.

When the folding portion comprises the insulating base layer, the conductive layer, the insulating cover layer, or a combination thereof, the folding portion and the wired circuit portion can be formed of a common layer, whereby a cost reduction and a productivity improvement can be achieved by forming.

In the wired circuit board according to the present invention, it is preferable that a width of a middle portion of the folding portion in a direction orthogonal to a coupling direction between the terminal formation portion and the reinforcing portion is smaller than a width of end portions of the terminal formation portion side thereof and the reinforcing portion side thereof.

When the width of the middle portion of folding portion in the direction orthogonal to the coupling direction between the reinforcing plate and the reinforcing portion is smaller than the width of the end portions of the terminal formation portion side thereof and the reinforcing portion side thereof, the folding portion can be easily folded at the middle portion. This can improve workability and the accuracy of aligning the reinforcing portion with the terminal formation portion after the folding portion is folded over.

BRIEF DESCRIPTION OF THE DRAWINGS

FIG. 3 shows the wired circuit board shown in FIG. 1:
(a) showing a cross-sectional view taken along the line A-A; and
(b) showing a cross-sectional view taken along the line B-B;

FIG. 6 is a manufacturing process diagram for manufacturing wired circuit boards, which is a cross-sectional view taken along the line A-A of FIG. 1;

DESCRIPTION OF THE PREFERRED EMBODIMENTS

Figure 1:
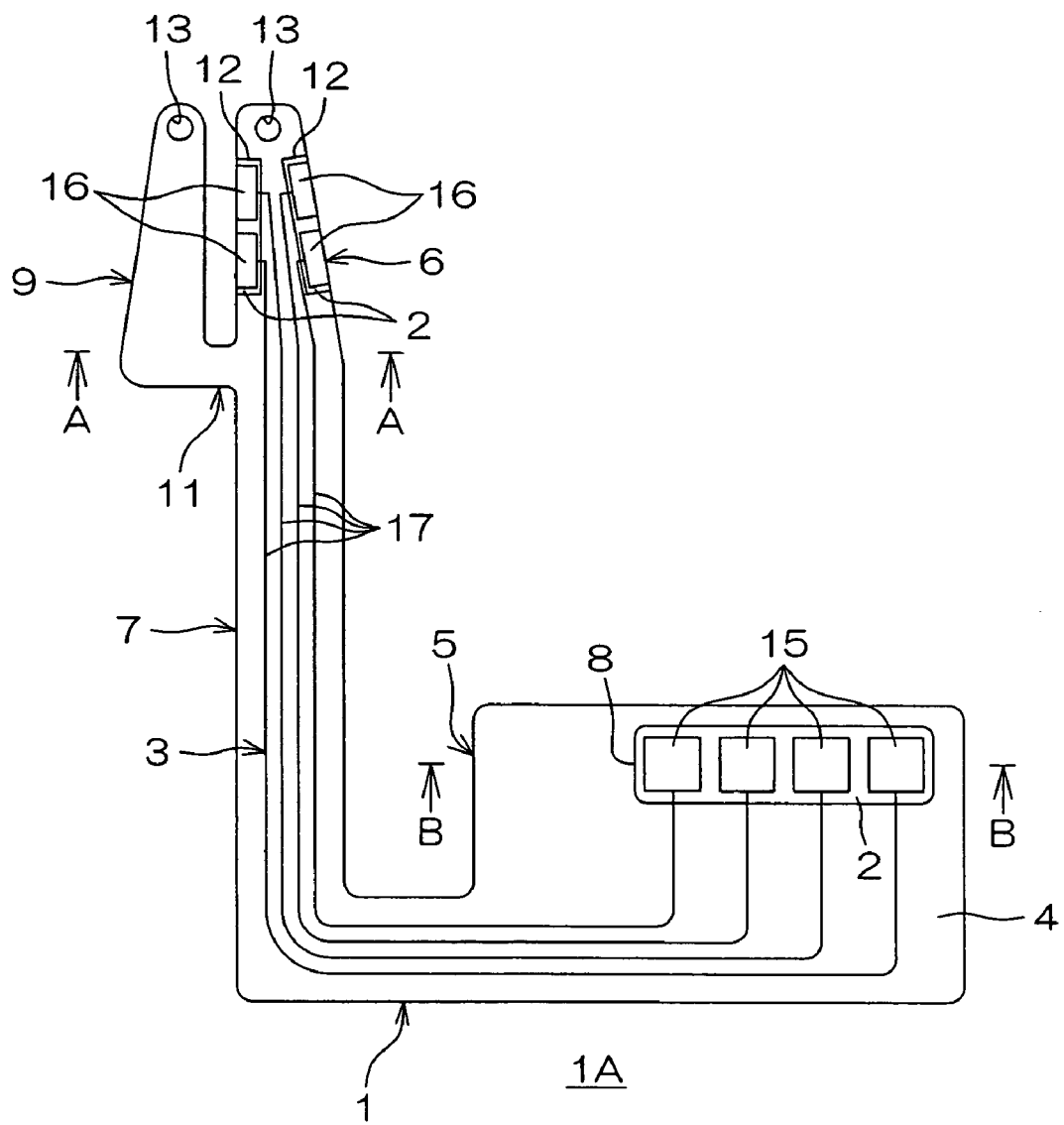
FIG. 1 is a plan view of a wired circuit board according to an embodiment of the present invention.
Figure 2:
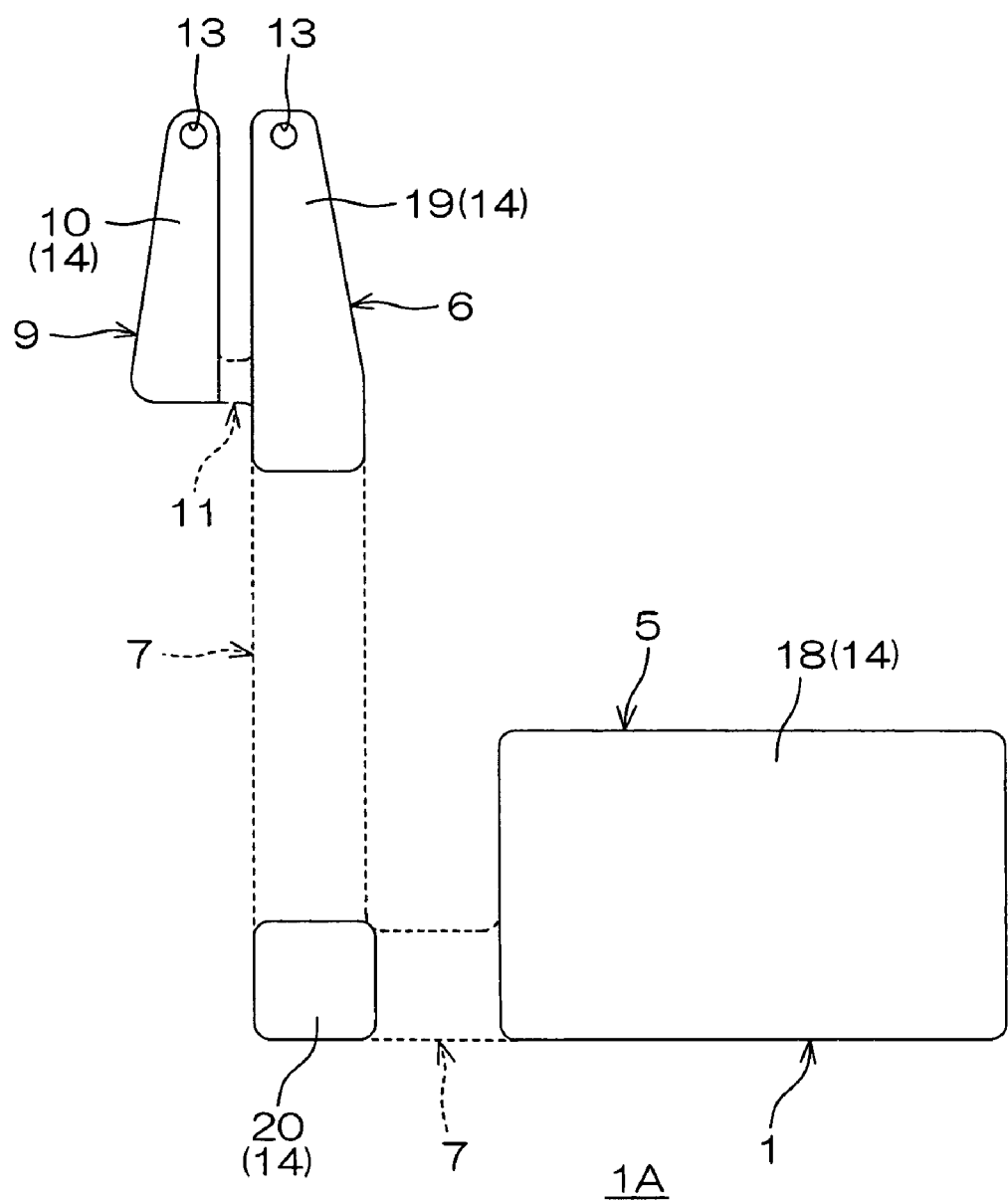
FIG. 2 is a bottom view showing an arrangement of supporting layers on the wired circuit board shown in FIG. 1.

FIG. 1 is a plan view of a wired circuit board according to an embodiment of the present invention. FIG. 2 is a bottom view showing an arrangement of supporting layers on the wired circuit board shown in FIG. 1. FIG. 3 shows the wired circuit board shown in FIG. 1: 3(a) showing a cross-sectional view taken along the line A-A, and FIG. 3(b) showing a cross-sectional view taken along the line B-B.

In FIG. 1, a wired circuit board 1A is a flexible wired circuit board and comprises a wired circuit portion 1, a reinforcing portion 9, and a folding portion 11.

The wired circuit portion 1 is formed in a generally L-shape when viewed in a plan view and integrally comprises a first connecting portion 5 for connecting to a connector or the like, a second connecting portion 6 as a terminal formation portion for connecting to an external circuit or the like and a flat wired portion 7 for coupling the first connecting portion 5 and the second connecting portion 6.

The first connecting portion 5 has a generally rectangular shape when viewed in a plan view and comprises a first terminal portion 8 formed with a plurality of first terminals 15 (which is described later) to be electrically connected to a connector or the like. The first terminal portion 8 is provided in the rear end of the first connecting portion 5 (the front and rear sides thereof correspond to one and the other sides in the direction in which wires 17 extend, which is described later) to have a narrow rectangular shape extended in a widthwise direction (corresponding to a direction orthogonal to the direction in which the wires 17 extend (front-to-rear direction), which is described later).

The second connecting portion 6 is formed in a generally rectangular shape with a tapered tip when viewed in a plan view and comprises second terminal portions 12 each formed with a plurality of second terminals 16 (which is described later) to be electrically connected to an external circuit or the like. The second terminal portions 12 are provided at the both side ends of the second connecting portion 6 in the widthwise direction such that each of them extends in the front-to-rear direction.

The flat wired portion 7 has a generally L-shape when viewed in a plan view and is provided so as to couple one side end of the first connecting portion 5 and the rear end of the second connecting portion 6.

The reinforcing portion 9 is formed in a generally rectangular shape with a tapered tip when viewed in a plan view, which is substantially the same, but slightly smaller than the second connecting portion 6. The reinforcing portion 9 is disposed on one side of the second connecting portion 6 in parallel spaced-apart relation in the widthwise direction to have a tip thereof aligned with the tip of the second connecting portion 6.

The folding portion 11 is provided in the widthwise direction so as to couple the side edge of the rear end of the reinforcing portion 9 which is opposed to the second connecting portion 6 and the side edge of the rear end of the second connecting portion 6 which is opposed to the side edge of the rear end of the reinforcing portion 9.

The folding portion 11 is formed to have substantially the same width in a direction orthogonal to the direction (i.e., the widthwise direction in which the reinforcing portion 9 and the second connecting portion 6 are coupled) in which the reinforcing portion 9 and the second connecting portion 6 are opposed.

As is described later, fixation holes 13 are formed in the respective tips of the second connecting portion 6 and the reinforcing portion 9 to pierce therethrough such that they overlap each other when the reinforcing portion 9 is placed in laminated relation on the second reinforcing plate 19 of the second connecting portion 6, which is described later.

As shown in FIG. 3, the wired circuit board 1A comprises an insulating base layer 2, a conductive pattern 3 as a conductive layer formed on a surface of the insulating base layer 2 and an insulating cover layer 4 formed on the surface of the insulating base layer 2 in such a manner as to cover a surface of the conductive pattern 3. The wired circuit board 1A also comprises supporting layers 14 which are formed partially on the back surface of the insulating base layer 2.

As shown in FIGS. 1 and 2, the insulating base layer 2 is formed in a pattern having the basic appearance of the wired circuit board 1A, i.e., a generally L-shape when viewed in a plan view, and continuous over the wired circuit portion 1, the reinforcing portion 9, and the folding portion 11.

The insulating base layer 2 is formed of a synthetic resin film made of, e.g., a polyimide resin, an acrylic resin, a polyethernitrile resin, a polyethersulfone resin, a polyethylene terephthalate resin, a polyethylene naphthalate resin, or a polyvinyl chloride resin. As the synthetic resin, a photosensitive synthetic resin is used preferably or, more preferably, a photosensitive polyimide resin is used.

Preferably, the thickness of the insulating base layer 2 is in the range of, e.g., 3 to 30 μm, or preferably 5 to 15 μm.

As shown in FIG. 1, the conductive pattern 3 is formed continuously over the first connecting portion 5, the flat wired portion 7, and the second connecting portion 6. The conductive pattern 3 integrally comprises the plurality of first terminals 15, the plurality of second terminals 16, and the plurality of wires 17 connecting the first terminals 15 and the second terminals 16.

Each of the first terminals 15 is made of a quadrilateral land. The first terminals 15 are provided on the first terminal portion 8 of the first connecting portion 5 in mutually spaced-apart relation in the widthwise direction. Each of the first terminals 15 is not limited to the quadrilateral land and may also be a round land.

Each of the second terminals 16 is made of a quadrilateral land. Each of the second terminals 16 are provided on each of the second terminal portions 12 provided at both side ends of the second terminal portion 6 in the widthwise direction such that they are arranged in mutually spaced-apart relation in the front-to-rear direction. Each of the second terminals 16 is not limited to the quadrilateral land and may also be a round land.

The individual wires 17 are arranged in parallel and mutually spaced-apart relation in the widthwise direction to extend over the first connecting portion 5, the flat wired portion 7, and the second connecting portion 6, thereby providing connection between the first terminals 15 and the second terminals 16.

The conductive pattern 3 is formed of conductive foil (metal foil) made of, e.g., copper, nickel, gold, a solder, or an alloy thereof. In terms of conductivity, inexpensiveness, and processibility, copper foil is preferably used.

Preferably, the thickness of the conductive pattern 3 is in the range of, e.g., 3 to 20 µm, or preferably 7 to 15 µm. In the flat wired portion 7, the width of each of the wires 17 is in the range of, e.g., 5 to 500 µm, or preferably 10 to 200 µm, while the spacings between the individual wires 17 are in the range of, e.g., 5 to 500 µm, or preferably 10 to 200 µm.

The insulating cover layer 4 has substantially the same shape as the insulating base layer 2 and is formed in a pattern which continues over the wired circuit portion 1, the reinforcing portion 9, and the folding portion 11.

The insulating cover layer 4 is formed with openings for individually exposing the first terminals 15 and the second terminals 16. These openings individually form the first terminal portion 5 and the second terminal portions 12.

For the insulating cover layer 4, the same synthetic resin film as used for the insulating base layer 2 described above is used. As the synthetic resin, a photosensitive polyimide resin is preferably used. The thickness of the insulating cover layer 4 is in the range of, e.g., 3 to 20 µm, or preferably 4 to 15 µm.

As show in FIG. 2, the supporting layers 14 are provided in separate relation in the first connecting portion 5, the flat wired portion 7, the second connecting portion 6, and the reinforcing portion 9.

In the first connecting portion 5, the supporting layer 14 is provided on the entire back surface of the insulating base layer 2 to serve as a first reinforcing plate 18 for reinforcing the first terminal portion 8. In the second connecting portion 6, the supporting layer 14 is provided on the entire back surface of the insulating base layer 2 to serve as the second reinforcing plate 19 for reinforcing the second terminal portions 12. In the flat wired portion 7, the supporting layer 14 is provided in a generally square shape on the back surface of the insulating base layer 2 which corresponds to the bent portion of the generally L-shape to serve as a third reinforcing plate 20 for reinforcing the bent portion. In the reinforcing portion 9, the supporting layer 14 is provided on the entire surface of the insulating base layer 2 to serve as a fourth reinforcing plate 10 for reinforcing the second terminal portions 12.

By thus placing the supporting layers 14, in the wired circuit board 1, flexibility is imparted to the portions located between the first connecting portion 5 and the bent portion of the flat wired portion 7, and between the second connecting portion 6 and the bent portion of the flat wired portion 7.

The supporting layer 14 is formed of a sheet made of a metal such as, e.g., stainless steel or a 42-alloy. Preferably, stainless steel is used as the metal. The thickness of the supporting layer 14 is in the range of, e.g., 10 to 100 µm, or preferably 15 to 65 µm.

Figure 4:
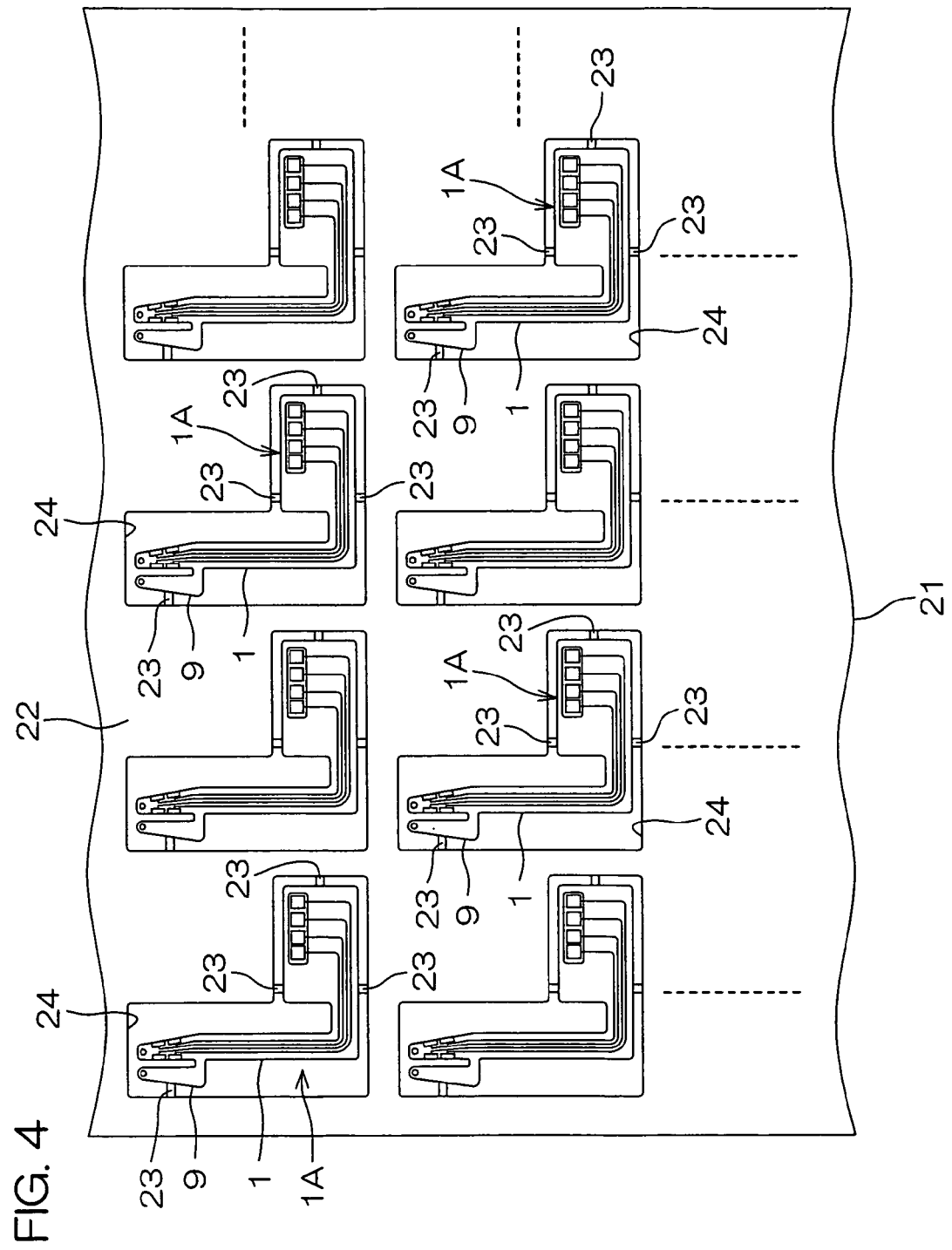
FIG. 4 is a plan view of a sheet in which a plurality of wired circuit boards are formed.

FIG. 4 is a plan view of a sheet in which a plurality of wired circuit boards are formed.

As shown in FIG. 4, a plurality of wired circuit boards 1A are typically formed on a single belt-like long sheet 21 in mutually spaced-apart relation.

The sheet 21 comprises the plurality of wired circuit boards 1A and a support frame 22 which separably supports the plurality of wired circuit boards 1A.

As shown in FIG. 4, the individual wired circuit boards 1A are arranged and aligned in mutually spaced-apart relation within the support frame 22. Each of the wired circuit boards 1A is supported by the support frame 22 via joint portions 23 which can be cut.

In the support frame 22, clearance grooves 24 each having a generally frame-like shape when viewed in a plan view are formed between the inner peripheries of the support frame 22 surrounding the individual wired circuit boards 1A and the respective outer peripheries of the wired circuit boards 1A in such a manner as to individually surround the wired circuit boards 1A.

The joint portions 23 are provided between the inner peripheries of the support frame 22 and the respective outer peripheries of the wired circuit boards 1A in such a manner as to traverse the clearance grooves 24. The positions at which the joint portions 23 are formed and the number of the joint portions 23 are determined appropriately depending on the size and shape of each of the wired circuit boards 1A.

Figure 5:
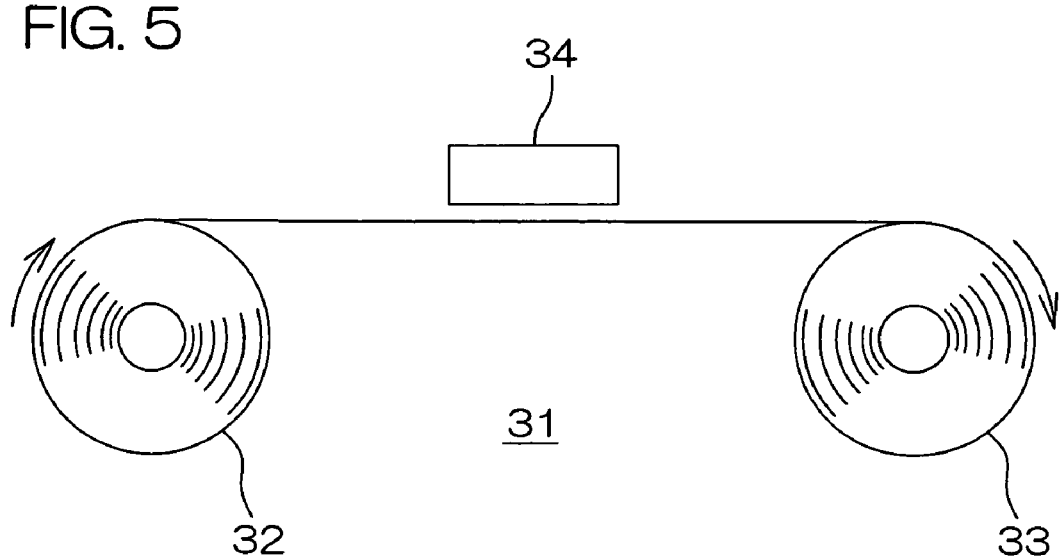
FIG. 5 is a schematic structural view of an apparatus for manufacturing wired circuit boards as a sheet.

FIG. 5 is a schematic structural view of an apparatus for manufacturing wired circuit boards as a sheet. FIG. 6 is a manufacturing process diagram for manufacturing wired circuit boards, which is a cross-sectional view taken along the line A-A of FIG. 1.

To manufacture the wired circuit boards 1A as the sheet 21, a manufacturing apparatus 31 as shown in FIG. 5 is used. The manufacturing apparatus 31 is used for a roll-to-roll production system and comprises a feed-out roll 32, a wind-up roll 33, and a processing unit 34.

The feed-out roll 32 and the wind-up roll 33 are arranged in mutually spaced-apart and opposing relation in the direction of transport of the sheet 21, and the processing unit 34 is provided therebetween.

In the manufacturing apparatus 31, the sheet 21 is wound around the feed-out roll 32 into the form of a roll. The sheet 21 is fed out of the feed-out roll 32, while it is wound up into the form of a roll by the wind-up roll 33. In the processing unit 34 which is located on the way of transport of the sheet 21 being transported, the various steps of manufacturing the wiring circuit boards 1A are performed.

Next, a description is given to a method for manufacturing each of the wired circuit boards 1A using the manufacturing apparatus 31 shown in FIG. 5 with reference to FIG. 6.

First, as shown in FIG. 6(a), a sheet 21 is prepared. The sheet 21 has a long belt-like shape and is made of a metal sheet for forming a supporting layer 14.

Next, as shown in FIG. 6(b), a plurality of insulating base layer 2 is formed on a surface of the sheet 21 in correspondence to individual wired circuit boards 1A.

The formation of the insulating base layers 2 is performed by, e.g., applying a solution (varnish) of a synthetic resin onto the surface of the sheet 21, drying the applied solution, and then heating it as necessary such that the synthetic resin is cured.

When a photosensitive synthetic resin is used, the insulating base layers 2 can be formed in a pattern (pattern in which fixation holes 13 are formed in the respective wired circuit boards 1A) corresponding to the individual wired circuit boards 1A by exposing the photosensitive synthetic resin to light and developing it.

The formation of the insulating base layers 2 is not limited to the method described above. For example, it is also possible to preliminarily form a synthetic resin into a film and bond the film to the surface of the sheet 21 via a known adhesive agent layer.

Next, as shown in FIG. 6(c), a plurality of conductive patterns 3 is formed on the respective surfaces of the insulating base layers 2 in correspondence with the individual wired circuit boards 1A. The formation of the conductive patterns 3 is performed by a known patterning method such as an additive method or a subtractive method. Preferably, the additive method is used.

Next, as shown in FIG. 6(d), insulating cover layers 4 are formed on the respective surfaces of the individual insulating base layers 2 in such a manner as to cover the individual conductive patterns 3.

The formation of the insulating cover layers 4 is performed by, e.g., applying a solution of the synthetic resin shown above, drying the applied solution, and then heating it as necessary such that the synthetic resin is cured.

The insulating cover layers 4 can also be formed in a pattern (pattern in which the fixation holes 13 are formed in the respective wired circuit boards 1A) corresponding to the individual wired circuit boards 1A by exposing a photosensitive synthetic resin and developing it.

The formation of the individual insulating cover layers 4 is not limited to the method described above. For example, it is also possible to preliminarily form a synthetic resin into a film and bond the film to the surface of each of the insulating base layers 2 via a known adhesive agent layer in such a manner as to cover each of the conductive patterns 3.

Each of the insulating cover layers 4 is formed to have respective openings corresponding to the first terminal portion 8 and the second terminal portions 12. The openings corresponding to the first terminal portion 8 and the second terminal portions 12 are formed in a pattern using the photosensitive synthetic resin shown above or bored by laser processing or punching.

Next, as shown in FIG. 6(e), clearance grooves 24 are opened by etching the sheet 21 to form wired circuit boards 1A, support frames 22, and joint portions 23, and form supporting layers 14 on the respective back surfaces of the insulating base layers 2 of the individual wired circuit boards 1A.

To etch the sheet 21, the sheet 21 is first covered with an etching resist such that the portions of each of the clearance grooves 24 and the regions of the wired circuit boards 1A except that the supporting layers 14 are not formed are exposed and then the portions of the sheet 21 which are exposed from the etching resist are opened by wet etching or the like.

By the etching, the clearance grooves 9 are formed in the portions of the sheet 21 which are cut away, while the plurality of wired circuit boards 1A, the support frame 22 for supporting the wired circuit boards 1A, and the plurality of joint portions 23 coupling the wired circuit boards 1A and the support frame 22 are formed from the portions of the sheet 21 which are remained without being cut away. In each of the wired circuit boards 1A, the supporting layers 14 are formed locally on the back surface of the insulating base layer 2 to serve as the first, second, third, and fourth reinforcing plates 18, 19, 20, and 10, while the fixation holes 13 are bored in the reinforcing portion 9 and in the second connecting portion 6.

In this manner, the wired circuit boards 1A are formed in the single sheet 21. In each of the wired circuit boards 1A, the conductive pattern 3 is not formed on the reinforcing portion 9 and the reinforcing portion 9 is formed of three layers, having the supporting layer 14 (fourth reinforcing plate 10), the insulating base layer 2, and the insulating cover layer 4. On the folding portion 11, the conductive pattern 3 and the supporting layer 14 are not formed. The folding portion 11 is formed of two layers, having the insulating base layer 2 and the insulating cover layer 4.

The plurality of wired circuit boards 1A thus formed in the sheet 21 are stored or transported as the single wound-up sheet 21 in the form of a roll. When the wired circuit boards 1A are used, they are cut away from the support frame 22 by cutting off the joint portions 23 for individual applications.

Figure 7:
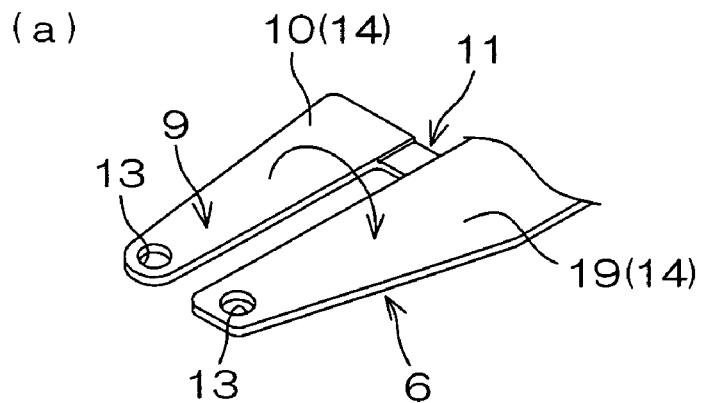
FIG. 7 is a perspective bottom view illustrating a method for using the wired circuit board.
Figure 8:
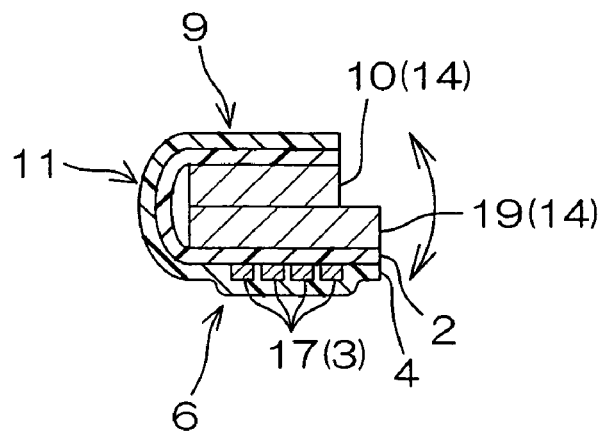
FIG. 8 is a widthwise cross-sectional view of the wired circuit board shown in FIG. 7.

FIG. 7 is a perspective bottom view illustrating a method for using the wired circuit board FIG. 8 is a widthwise cross-sectional view of the wired circuit board shown in FIG. 7.

Next, a description is given to a method for using the wired circuit board 1A with reference to FIGS. 7 and 8.

When the wired circuit board 1A thus obtained is used, the reinforcing portion 9 is placed in laminated relation on the second connecting portion 6 by folding the folding portion 11 over (valley-folding) in the front-to-rear direction to provide contact between the back surface of the fourth reinforcing plate 10 of the reinforcing portion 9 and the back surface of the second reinforcing plate 19 of the second connecting portion 6, as shown in FIG. 7(a).

By thus placing the reinforcing portion 9 in laminated relation on the second connecting portion 6, the fixation hole 13 in the reinforcing portion 9 is communicated with the fixation hole 13 in the second connecting portion 6 in the thicknesses direction thereof so that a pin 26 is inserted through the fixation holes 13 to fix the reinforcing portion 9 and the second connecting portion 6 to each other, as shown in FIG. 7(b).

Thus, in the wired circuit board 1A, when the folding portion 11 is folded over to laminate the reinforcing portion 9 on the second connecting portion 6, the second connecting portion 6 can be reinforced with the second reinforcing plate 19 and the reinforcing portion 9 to ensure a high rigidity by thickening the reinforced part. As a result, the second terminals 16 can be electrically connected by connecting an external circuit or the like to the second connecting portion 6.

Since the support frame 22 supports the reinforcing portion 9 together with the wired circuit portion 1 in the same plane via the folding portion 11 and the second connecting portion 6 is reinforced only with the second reinforcing plate 19 before the wired circuit board 1A is used, the reinforced part can be thinned. As a result, when the sheet 21 is wound in the manufacturing thereof, it can be easily wound up and stored or transported in the form of a roll to achieve easy handling.

Moreover, in the wired circuit board 1A, the second connecting portion 6 can be reinforced by merely folding the folding portion 11 over and bringing the back surface of the fourth reinforcing plate 10 of the reinforcing portion 9 to laminate on the back surface of the second reinforcing plate 19. This achieves a cost reduction compared with the case where the reinforcing portion 9 is bonded to the second reinforcing plate 19 via an adhesive agent, and a productivity improvement by eliminating the necessity for such a bonding step.

Since the reinforcing portion 9 of the wired circuit board 1A is formed of the supporting layer 14, the insulating base layer 2, and the insulating cover layer 4 which are the same as layers of the wired circuit portion 1, a cost reduction and a productivity improvement can be achieved.

Since the folding portion 11 of the wired circuit board 1A is formed of the insulating base layer 2 and the insulating cover layer 4 which are the same as layers of the reinforcing portion 9 and the wired circuit portion 1, a further cost reduction and a further productivity improvement can be achieved.

Figure 9:
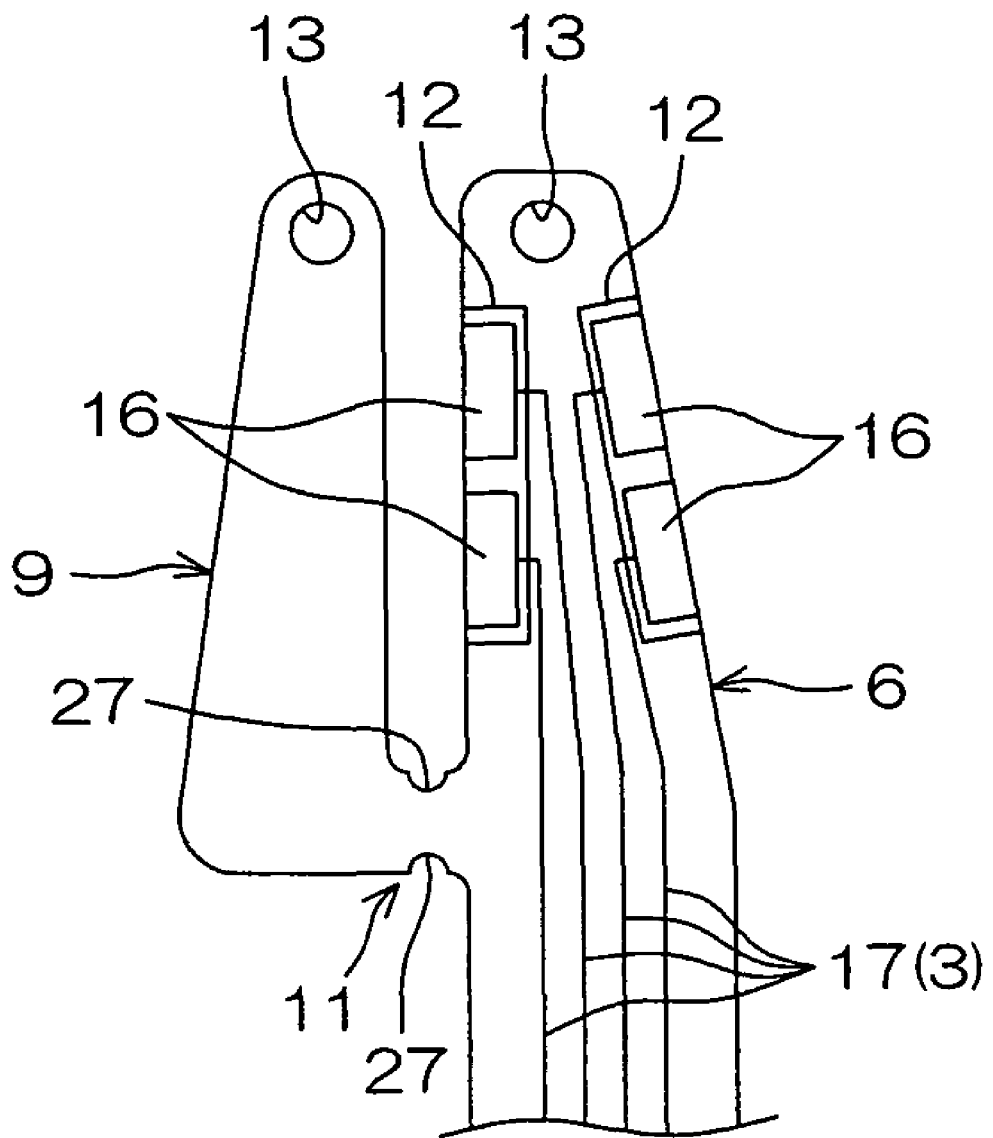
FIG. 9 is an enlarged plan view of a principal portion of a second connecting portion and a reinforcing portion, which illustrates an embodiment of the wired circuit board shown in FIG. 1 having recessed portions formed in the folding portion thereof.

Although the folding portion 11 of the wired circuit board 1A described above is formed to have substantially the same width in the front-to-rear direction orthogonal to the direction in which the reinforcing portion 9 and the second connecting portion 6 are coupled, it is also possible to, e.g., form recessed portions 27 in the center portion of the folding portion 11 in the coupling direction between the reinforcing portion 9 and the second connecting portion 6 such that they are gradually recessed in inward directions from the both edges of the folding portion 11 in the front-to-rear direction orthogonal to the coupling direction, as shown in FIG. 9.

By thus forming such recessed portions 27, the folding portion 11 formed with the recessed portions 27 may have a width in the front-to-rear direction at the center portion between the second connecting portion 6 and the reinforcing portion 9 smaller than at the both end portions in the widthwise direction, i.e., than at the end portions of the second connecting portion 6 side thereof and the reinforcing portion 9 side thereof. This achieves the folding portion 11 to be easily folded over at the center portion thereof. As a result, workability can be improved. In addition, the accuracy of aligning the reinforcing portion 9 with the second connecting portion 6 after the folding portion 11 is folded over can be improved.

Instead of forming the recessed portions 27, it is also possible to inwardly notch the both edges of the folding portion 11 in the front-to-rear direction, thereby forming notches into a generally V-shape when viewed in a plan view.

Figure 10:
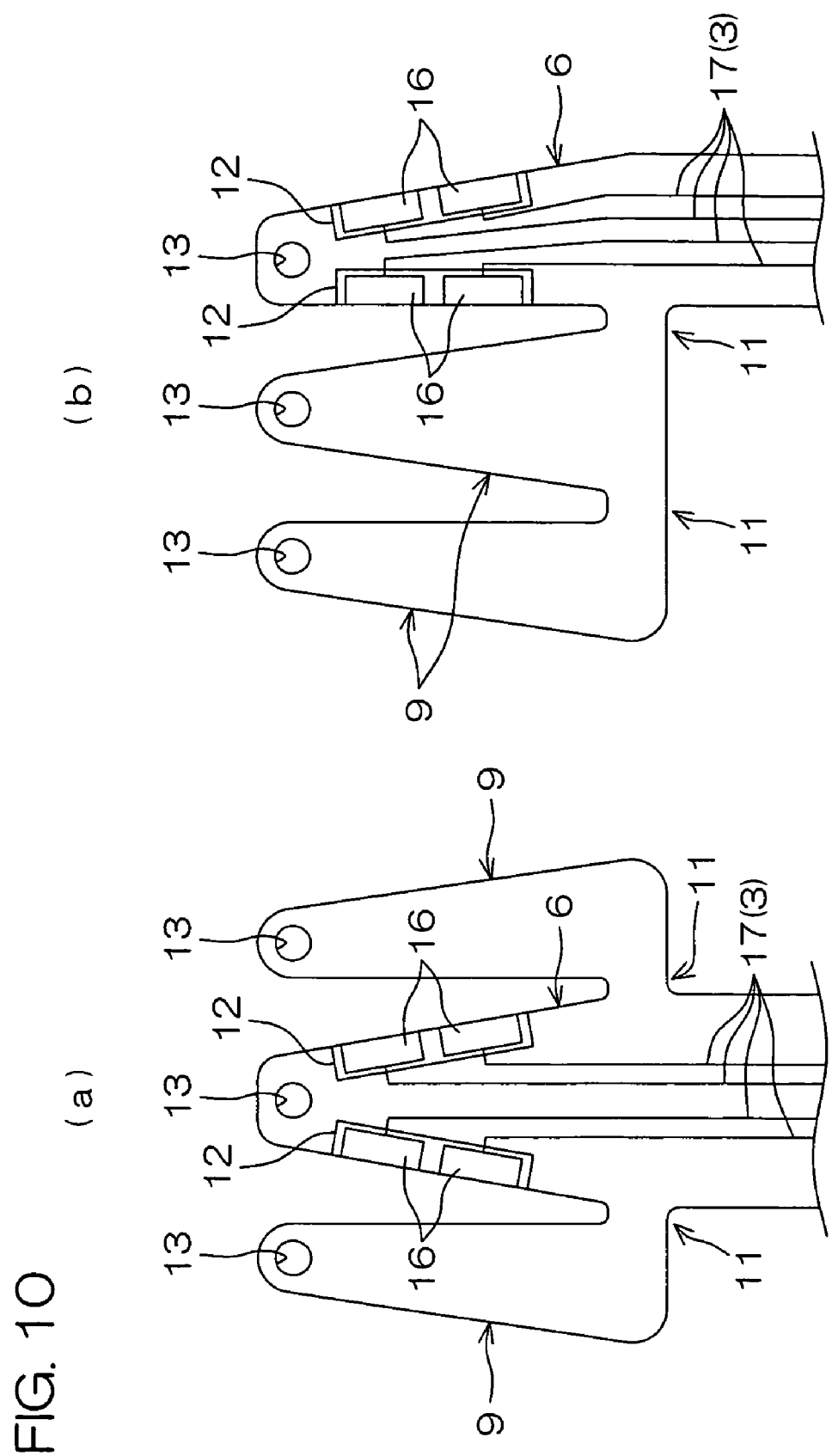
FIG. 10 shows the wired circuit board shown in FIG. 1, of which:
(a) showing an enlarged plan view of a principal portion of an embodiment in which reinforcing portions are provided in symmetrical relation relative to the second connecting portion; and
(b) showing an enlarged plan view of a principal portion of an embodiment in which a plurality of reinforcing portions are provided on one side of the second connecting portion in the widthwise direction.

Although the wired circuit board 1A described above has the reinforcing portion 9 provided on one side of the second connecting portion 6 in the widthwise direction, it is also possible to provide the (two) reinforcing portions 9 on widthwise both sides of the second connecting portion 6 in symmetrical relation, as shown in FIG. 10A, and laminate the two reinforcing portions 9 on the second connecting portion 6, depending on the purpose and application thereof. Alternatively, it is also possible to provide the plurality of (two) reinforcing portions 9 on widthwise one side of the second connecting portion 6, as shown in FIG. 10(b), and successively laminate the reinforcing portions 9 on the second connecting portion 6. This achieves a further increase in the thickness of the reinforced part, and easier adjustment of the thickness of the reinforced part.

Moreover, it is also possible to appropriately combine the embodiment shown in FIG. 10(a) with the embodiment shown in FIG. 10(b), depending on the purpose and application thereof.

Although the reinforcing portion 9 of the wired circuit board 1A is formed of the three layers of the supporting layer 14, the insulating base layer 2, and the insulating cover layer 4 in the description given above, the reinforcing portion 9 may also be formed of two layers having, e.g., the supporting layer 14 and the insulating base layer 2, the supporting layer 14 and the insulating cover layer 4, or the insulating base layer 2 and the insulating cover layer 4. Alternatively, it is also possible to form the reinforcing portion 9 of one layer, having the supporting layer 14, the insulating base layer 2, or the insulating cover layer 4. However, the reinforcing portion 9 preferably comprises at least the supporting layer 14 to provide an effective reinforcing effect.

Although the folding portion 11 is formed of the two layers of the insulating base layer 2 and the insulating cover layer 4 in the description given above, the folding portion 11 can also be formed of three layers having, e.g., the insulating base layer 2, the conductive pattern 3, and the insulating cover layer 4; two layers having, e.g., the insulating base layer 2 and the conductive pattern 3, or the conductive pattern 3 and the insulating cover layer 4; or one layer having the insulating base layer 2, the conductive pattern 3, or the insulating cover layer 4.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a wired circuit portion comprising:
      a supporting layer made of a metal;
      an insulating base layer made of a resin and formed on a surface of the supporting layer;
      a conductive layer made of a conductor and formed on a surface of the insulating base layer;
      an insulating cover layer made of a resin and formed on a surface of the conductive layer; and
      a terminal formation portion formed with a terminal portion and a reinforcing plate provided at least on the terminal formation portion;
   a reinforcing portion which is laminated on a further separate reinforcing plate, the reinforcing portion being devoid of a terminal portion to which an electronic component is connected; and
   a folding portion which couples the terminal formation portion and the reinforcing portion, and is foldable,
   wherein the reinforcing plate is formed of the supporting layer, and the reinforcing portion comprises at least the supporting layer,
   wherein the supporting layer serves as the further separate reinforcing plate, and
   wherein, when the wired circuit board is used, the folding portion is folded over to laminate the reinforcing portion including the further separate reinforcing plate on the reinforcing plate of the wired circuit portion, thereby to reinforce the terminal formation portion with the further separate reinforcing plate and the reinforcing portion.

2. A wired circuit board according to claim 1, wherein the folding portion comprises at least one layer selected from the group consisting of the insulating base layer, the conductive layer, and the insulating cover layer.

3. A wired circuit board according to claim 1, wherein the folding portion comprises recessed portions formed in a middle portion thereof, such that a width of the middle portion of the folding portion in a direction orthogonal to a coupling direction between the terminal formation portion and the reinforcing portion is reduced.

4. A wired circuit board comprising:
   a wired circuit portion comprising a terminal formation portion formed with a terminal portion and a reinforcing plate provided at least on the terminal formation portion;
   a reinforcing portion which is laminated on a further separate reinforcing plate, the reinforcing portion being devoid of a terminal portion to which an electronic component is connected; and
   a folding portion which couples the terminal formation portion and the reinforcing portion, and is foldable,
   wherein, when the wired circuit board is used, the folding portion is folded over to laminate the reinforcing portion including the further separate reinforcing plate on the reinforcing plate of the wired circuit portion, thereby to reinforce the terminal formation portion with the further separate reinforcing plate and the reinforcing portion, and wherein the wired circuit portion comprises a fixation hole passing therethrough, and the reinforcing portion comprises a further fixation hole passing therethrough, and further comprising a pin inserted through the fixation holes to fix the reinforcing portion and the wired circuit portion to each other when the wired circuit board is used.

* * * * *